June 8, 1965 D. P. DORSEY 3,188,489
MONOSTABLE MULTIVIBRATOR HAVING EMITTER FOLLOWER FEEDBACK CONTROLLED BY A TIMING NETWORK
Filed March 27, 1962
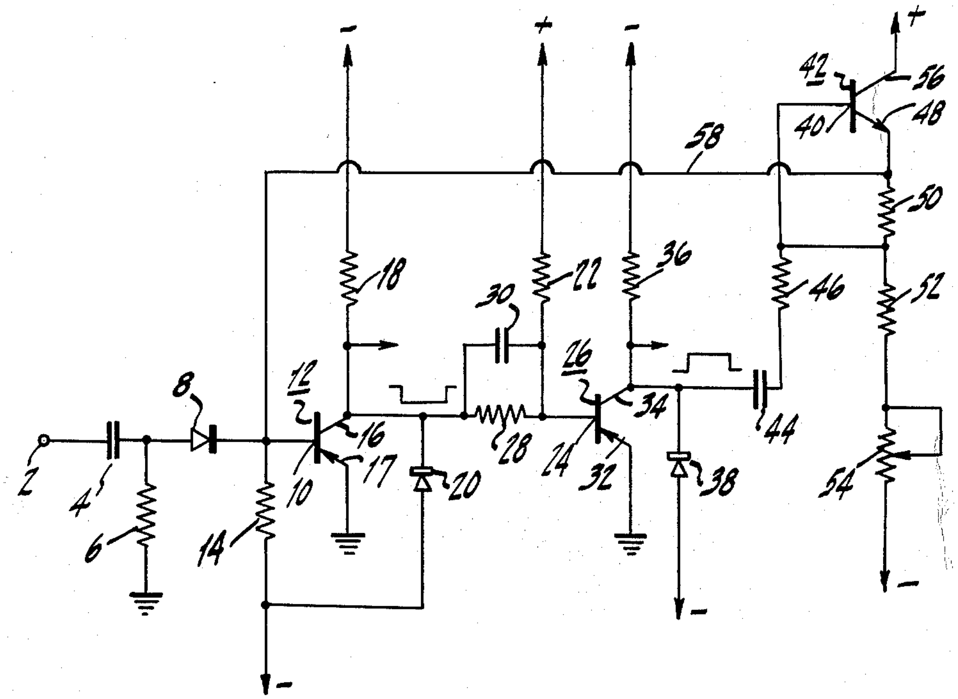
INVENTOR.
DENIS P. DORSEY
BY John V. Regan
Attorney United States Patent Office 3,188,489

Patented June 8, 1965

3,188,489

MONOSTABLE MULTIVIBRATOR HAVING EMITTER FOLLOWER FEEDBACK CONTROLLED BY A TIMING NETWORK

Denis P. Dorsey, Levittown, Pa., assignor to Radio Corporation of America, a corporation of Delaware Filed Mar. 27, 1962, Ser. No. 182,837

7 Claims. (Cl. 307—88.5)

This invention relates to a monostable multivibrator or variable delay system in which the produced pulse may be of long duration.

In the production of pulses to be used to inhibit or enable digital computer logic circuitry or to provide variable delay times, errors may be induced into the computer by lack of distinctness of the start and end of a control pulse. It is therefore important that the rise and fall times of the pulse be very short. This requirement of short rise and fall time of pulses so used extends to long duration pulses.

It is therefore an object of this invention to provide a circuit for producing variable length pulses of up to several seconds duration, and yet which have a very short rise or fall time, for example, of less than one-half of a microsecond.

This invention comprises a monostable multivibrator including a cascaded plurality of transistors of one type, the output of which is applied to a transistor of another type. The other type transistor operates as an emitter follower. Clamping voltages are applied to the collectors of the cascaded transistors. The emitter of the emitter follower transistor is coupled back to the input of one of the cascaded transistors. A pulse of voltage is applied to the input of one of the cascaded transistors and the desired output pulses are taken from the collectors of the cascaded transistors.

This invention is more fully explained in connection with the single figure of the accompanying drawing which shows a diagram of the circuit of this invention.

In the single figure, an input terminal 2 is connected to ground by way of a differentiating circuit comprising condenser 4 and resistor 6 connected in series. A rectifier such as a diode 8 is connected between the connection of condenser 4 to resistor 6 and the base 10 of PNP transistor 12. The base 10 is also connected to a source of voltage, which is negative with respect to ground, through resistor 14. The collector 16 of transistor 12 is connected to a more highly negative point through resistor 18. Collector 16 is clamped to the first mentioned negative voltage source by providing a connection of said first mentioned negative source through a rectifier such as diode 20 to collector 16. The emitter 17 of transistor 12 is grounded.

A positive source is connected through resistor 22 to the base 24 of a second PNP transistor 26. The base 24 is also connected to the collector 16 of transistor 12 by way of a resistor 28 and a condenser 30 in parallel, whereby an ohmic coupling connection exists between collector 16 and base 24 through resistor 28. Resistors 22 and 28 act as a coupling voltage divider between the collector 16 of transistor 12 and the base 24 of transistor 26. Capacitor 30 acts as a conventional speed-up capacitor.

The emitter 32 of transistor 26 is grounded and the collector 34 thereof is connected to a negative source through resistor 36. Clamping voltage is applied to the clolector 34 by way of a rectifier which may be a diode 38 connected between a negative source and collector 34. The collector 34 of transistor 26 is coupled to the base 40 of an NPN transistor 42 by means of a high capacity condenser 44 and a resistor 46 in series. The emitter 48 of transistor 42 is connected to a negative source through the series arrangement of a plurality of resistors 50, 52 and 54 of which resistor 54 is variable. The base 40 is connected to the emitter 48 through resistor 50. The collector 56 of transistor 42 is connected directly to a positive voltage source. In this manner, NPN transistor 42 acts as an emitter follower. The voltage appearing on emitter 48 is fed back by conductor 58 to the base 10 of transistor 12. The resistance 54 is made adjustable to control the length of the discharge time of condenser 44 and therefore of the pulse produced by this circuit.

As indicated in the drawing, a pair of output voltage pulses appear simultaneously in this circuit. A negative going voltage, for example, from about zero to about the value of the clamping voltage, appears on the collector 16. Simultaneously, a positive going voltage, for example, from a negative value to about zero volts appears on the collector 34.

The operation of the above-described monostable multivibrator, is as follows: In its quiescent state, the biasing of transistor 12 is such that it is in saturation condition, whereby its output voltage, that is, the voltage on collector 16 is substantially zero. The biasing of transistor 26, to the base 24 of which the collector 16 of transistor 12 is coupled, is then such that transistor 26 is nonconductive and therefore its collector 34 is clamped to a predetermined negative voltage by the clamping circuit including diode 38. While the above-mentioned biasing is preferred, the converse biasing of transistors 12 and 26 may be useful. The large capacitor 44 isolates the clamping voltage from base 40 of emitter follower 42 and therefore the emitter 48, which is directly connected to base 10, is at the same potential thereof.

When a trigger pulse is applied to input terminal 2, the pulse is differentiated by circuit elements 4 and 6, and the positive edge of the differentiated pulse is applied to base 10 through diode 8. The negative trailing edge of the input pulse is blocked by the diode 8. The positive edge of the input pulse cuts off transistor 12 and its collector 16 assumes the negative clamping voltage applied thereto through diode 20. The clamping voltage on collector 16 is applied through resistor 28 of voltage divider 22 and 28 to the base 24 of transistor 26 and drives it to saturation, causing a positive going step voltage to appear at collector 34, a negative going step voltage simultaneously appearing at collector 16 of transistor 12. The condenser 30 which is connected in parallel with the resistor 28 speeds up the rise of the output pulses appearing at the collectors 16 and 34. This step voltage is differentiated by condenser 44 and the resistors in the circuit of emitter 48. Due to the large capacity of condenser 44 and the large resistance of resistors in the circuit of emitter 48, a long discharge time is provided for condenser 44. The exponential decaying voltage appearing on base 40 of transistor 42 also appears on emitter 48 due to its emitter follower connection. This voltage on emitter 48 is fed back to base 10 and keeps transistor 10 cut off until the feed back voltage has fallen low enough to permit the biasing of transistor 12 to again saturate transistor 12. At this time the circuit is again at its stable or quiescent state. While the length of the pulses produced at collectors 16 and 34 may be several seconds long, the rise and fall time of the pulse is less than one-half of a microsecond.

The circuit is shown and described as having type PNP input and intermediate cascaded transistors and the other type or a type NPN feedback transistor in emitter follower configuration. However, on proper choice of sources, type NPN input and intermediate transistors and a PNP emitter follower transistor may be used.

What is claimed is:

1. A circuit for producing a long duration pulse having short rise and fall time comprising first and second transistors of one conductivity type, means for coupling the output electrode of said first transistor resistively to the input electrode of said second transistor, means for clamping the output electrodes of said first and second transistors to predetermined voltages, means for connecting the output electrode of said second transistor through a series connection including a condenser to the input electrode of a third transistor, said third transistor being of an opposite conductivity type to the first and second transistors, a variable resistance network for connecting another electrode of the third transistor to a voltage source, means for connecting a point on said resistance network to said input electrode of said third transistor, means for connecting said another electrode to the input electrode of the first transistor, and means for connecting still another electrode of said third transistor directly to a voltage source.

2. A circuit for producing a long duration pulse having short rise and fall time comprising a first and a second transistor of one conductivity type and a third transistor of a second, opposite conductivity type, means for connecting the output electrode of said first transistor to the input electrode of said second transistor, clamping means to apply clamping voltage to the output electrodes of said first and second transistors, means for connecting the output electrode of said second transistor through a condenser to the input electrode of said third transistor, resistance means for connecting another electrode of the third transistor to a source of voltage of one polarity, means for directly connecting a third electrode of said third transistor to a source of potential of the opposite polarity, means for connecting the input electrode of the third transistor to a point in the resistive connection of the other electrode thereof, and a feedback connection between said other electrode of said third transistor to the input electrode of said first transistor.

3. A circuit for producing a long duration pulse having short rise and fall time comprising a first and a second transistor of one type and a third transistor of another type, each of said transistors having base, emitter, and collector electrodes, means for applying an input pulse to the base of the first transistor, means to ground the emitters of the first and second transistors, means to apply a voltage of one polarity through a resistor to the collector of the first transistor, means to apply a voltage of the other polarity through a second resistor to the base of said second transistor, means to connect the collector of said first transistor through a third resistor to the base of said second transistor, means for clamping the collector of the first transistor to a voltage of said one polarity, and means for biasing the base of said first transistor so that said first transistor is saturated, means for applying a voltage of said one polarity to the collector of the second transistor, means for clamping said second-mentioned collector to a voltage of said one polarity, the voltages applied to the electrodes of said second transistor being such that the second transistor is normally biased to cut off, a condenser serially connected between the collector of said second transistor and the base of said third transistor, means for connecting the collector of said third transistor directly to a voltage source of said other polarity, means for connecting the emitter of said third transistor to a source of said one polarity through a series circuit including at least one resistor, means for connecting said last-mentioned base to a point on said last-mentioned series circuit, and means for connecting said last-mentioned emitter directly to the base of said first-mentioned transistor.

4. The combination comprising:

first, second, and third transistors, means for applying saturation biasing voltages to the first transistor, means for applying cut-off bias voltages to the second transistor, direct current coupling means coupling the output of the first transistor to the input of the second transistor, a timing circuit comprising the series combination of a capacitor and resistance means connected, in the order named, between the output of the second transistor and a point of fixed potential, a connection between the input of the third transistor and a point on said resistance means, means for connecting the third transistor as an emitter follower, a resistor connected between the input and emitter of the third transistor, and feedback means connected between the emitter of the third transistor and the input of the first transistor.

5. The combination as claimed in claim 4 including means for applying clamping voltages at the outputs of the first and second transistors.

6. The combination as claimed in claim 4, including means for applying an input pulse at the input of the first transistor, and wherein the direct current coupling means between the output of the first transistor and the input of the second transistor includes the parallel combination of a resistor and a capacitor.

7. The combination as claimed in claim 4 wherein the first and second transistors are of one conductivity type and the third transistor is of the opposite conductivity type.

References Cited by the Examiner

UNITED STATES PATENTS

| | | | |
|---|---|---|---|
| 2,837,663 | 6/58 | Walz | 307—88.5 |
| 2,882,350 | 4/59 | Stern et al. | 330—17 |

JOHN W. HUCKERT, *Primary Examiner.*

ARTHUR GAUSS, *Examiner.*